United States Patent
Theil

(10) Patent No.: US 11,056,348 B2
(45) Date of Patent: Jul. 6, 2021

(54) BONDING SURFACES FOR MICROELECTRONICS

(71) Applicant: Invensas Bonding Technologies, Inc., San Jose, CA (US)

(72) Inventor: Jeremy Alfred Theil, Mountain View, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/371,402

(22) Filed: Apr. 1, 2019

(65) Prior Publication Data
US 2019/0311911 A1    Oct. 10, 2019

Related U.S. Application Data

(60) Provisional application No. 62/653,315, filed on Apr. 5, 2018.

(51) Int. Cl.
*H01L 21/3105* (2006.01)
*H01L 21/02* (2006.01)
(Continued)

(52) U.S. Cl.
CPC .... *H01L 21/31053* (2013.01); *H01L 21/0217* (2013.01); *H01L 21/31111* (2013.01);
(Continued)

(58) Field of Classification Search
CPC .......... H01L 21/31053; H01L 21/0217; H01L 24/83; H01L 21/31111; H01L 2224/83031;
(Continued)

(56) References Cited

U.S. PATENT DOCUMENTS

| 5,753,536 A | 5/1998 | Sugiyama et al. |
| 5,771,555 A | 6/1998 | Eda et al. |

(Continued)

FOREIGN PATENT DOCUMENTS

| JP | 2013-33786 A | 2/2013 |
| JP | 2018-160519 A | 10/2018 |
| WO | 2005-043584 A2 | 5/2005 |

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.

(Continued)

*Primary Examiner* — Mohammad M Hoque
(74) *Attorney, Agent, or Firm* — Lee & Hayes, P.C.

(57) ABSTRACT

Improved bonding surfaces for microelectronics are provided. An example method of protecting a dielectric surface for direct bonding during a microelectronics fabrication process includes overfilling cavities and trenches in the dielectric surface with a temporary filler that has an approximately equal chemical and mechanical resistance to a chemical-mechanical planarization (CMP) process as the dielectric bonding surface. The CMP process is applied to the temporary filler to flatten the temporary filler down to the dielectric bonding surface. The temporary filler is then removed with an etchant that is selective to the temporary filler, but nonreactive toward the dielectric surface and toward inner surfaces of the cavities and trenches in the dielectric bonding surface. Edges of the cavities remain sharp, which minimizes oxide artifacts, strengthens the direct bond, and reduces the bonding seam.

14 Claims, 6 Drawing Sheets

(51) Int. Cl.
*H01L 23/00* (2006.01)
*H01L 21/311* (2006.01)

(52) U.S. Cl.
CPC .... *H01L 24/83* (2013.01); *H01L 2224/83031* (2013.01); *H01L 2224/83896* (2013.01)

(58) Field of Classification Search
CPC ....... H01L 2224/83896; H01L 2224/94; H01L 2224/8001; H01L 2224/80031; H01L 2224/80047; H01L 2224/80359; H01L 2224/80345; H01L 2224/08145; H01L 24/80; H01L 24/08; H01L 2224/80896; H01L 2224/03845; H01L 2224/03005
USPC ........................................................ 257/618
See application file for complete search history.

(56) References Cited

U.S. PATENT DOCUMENTS

| | | | |
|---|---|---|---|
| 6,034,393 A * | 3/2000 | Sakamoto | H01L 21/76229 257/315 |
| 6,080,640 A | 6/2000 | Gardner et al. | |
| 6,423,640 B1 | 7/2002 | Lee et al. | |
| 6,465,892 B1 | 10/2002 | Suga | |
| 6,541,382 B1 * | 4/2003 | Cheng | H01L 21/31053 257/E21.244 |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,507,979 B1 * | 8/2013 | Huang | H01L 29/4966 257/330 |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 9,142,517 B2 | 9/2015 | Liu | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,960,142 B2 | 5/2018 | Chen et al. | |
| 10,026,605 B2 | 7/2018 | Doub et al. | |
| 9,953,941 B2 | 8/2018 | Enquist | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2004/0126990 A1 * | 7/2004 | Ohta | H01L 29/7846 438/435 |
| 2006/0057945 A1 | 3/2006 | Hsu et al. | |
| 2006/0138368 A1 * | 6/2006 | Lee | G01N 21/9501 250/559.45 |
| 2007/0111386 A1 | 5/2007 | Kim et al. | |
| 2013/0034948 A1 * | 2/2013 | Huang | H01L 21/31055 438/424 |
| 2014/0175655 A1 | 6/2014 | Chen et al. | |
| 2015/0064498 A1 | 3/2015 | Tong | |
| 2015/0200073 A1 * | 7/2015 | Jen | H01J 37/302 250/282 |
| 2016/0343682 A1 | 11/2016 | Kawasaki | |
| 2017/0278698 A1 * | 9/2017 | Ikegawa | C23C 16/4554 |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |

OTHER PUBLICATIONS

Moriceau, H. et al., "Overview of Recent Direct Wafer Bonding Advances and Applications", Advances in Natural Sciences—Nanoscience and Nanotechnology, 2010, 12 pages.

Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

* cited by examiner

BONDING SURFACES FOR MICROELECTRONICS

RELATED APPLICATIONS

This patent application claims the benefit of priority to U.S. Provisional Patent Application No. 62/653,315, filed Apr. 5, 2018 and incorporated by reference herein, in its entirety.

BACKGROUND

Wafer-level microfabrication in the semiconductor arts often relies on etching to create trenches and cavities in wafer surfaces. A substrate of insulator material, such as silicon oxide, can be patterned with open trenches and cavities where a metal conductor will be deposited. Part of the wafer surface is protected from the etchant by a masking material. The masking material may be a photoresist that has been applied in a pattern, through photolithography.

After the etchant creates the cavities or trenches, copper metal (Cu) may be deposited on the insulator material, overfilling the trenches. Damascene processes may be used to inlay the open trenches with the copper metal. Then, chemical-mechanical planarization (CMP) may be used to remove the copper overburden above the top plane of the trench or cavity. The copper in the trenches remains as patterned conductive lines. The process may be repeated many times to build up many-layered interconnect structures. Cavities and trenches in a silicon oxide substrate may serve many other purposes besides hosting patterned conductors.

Both "trenches" are "cavities" are referred to herein as "cavities" to streamline the description, although trenches and cavities may have different origins and different purposes.

Rounding is the deviation in the dielectric surface extending from the interface with the meta that is no longer parallel to the silicon surface. Dielectric loss and surface planarity are important parameters for CMP in which Cu is to be involved in later stages of the fabrication. A barrier usually has a relatively slow removal rate, acting as a stop layer for dielectric removal on the larger field. Some wafer sections are cleared faster than others, resulting in surface nonplanarity. Appearance of step-like discontinuities may even appear near relatively harder areas due to redistribution of the contact forces. Each cavity edge is an interface between the dielectric layer and air. Polishing forces are orthogonal to these interfaces, resulting in an extreme redistribution of contact forces, thereby leading to a local increase in the dielectric removal rate. This causes oxide corner rounding, and as a result, dielectric erosion. Corner erosion allows the future Cu conductor to more easily protrude into the dip, setting the stage for eventual metal thinning in a next CMP stage and an increase in functional line resistance from the metal thinning.

Referring to FIG. 1, when fabricating bonded wafers with cavities 100 using a direct-oxide bonding process, a common process flow meticulously prepares the bonding surface 102 of the wafer for the contact bonding, then patterns and etches the wafer to form the cavities 100 as the last step before the contact bonding, as shown in FIG. 1. An example of such a direct oxide-bonding process is the ZiBond® brand direct bonding process (Ziptronix Inc. and Invensas Corporation, subsidiaries of Xperi Corporation, San Jose, Calif.). Silicon oxide 104 is a common material for the bonding surface 102 involved and thus for the interior surfaces 106 of the cavities 100. The silicon oxide 104, or other dielectric material, may be disposed over a layer of silicon 108, for example. The oxide surface topography 110 is often critical for achieving a high-quality bond, so the bonding surface 102 must have low surface roughness and little or no rounding 118 at the edges 112 of cavities 100 to ensure a good molecular bond, and must have a globally flat surface to bring the opposing surfaces close enough to enable bond formation at a molecule-to-molecule level for direct-bonding.

The surface and surface features at the edge 112 of each cavity 100 should therefore come to a sharp corner 112 that has low rounding 118 in order to ensure minimal bond seams adjacent to each cavity 100. Minimizing this bond seam at the edge 112 of each cavity 100 permits minimization of the associated oxide wall width in turn, thereby reducing overall cavity bonding seam dimensions. An obstacle in the process depicted in FIG. 1 arises because the oxide surface 102 may be covered with photoresist 114, an organic material applied onto the inorganic silicon oxide 104, which then has to be completely removed without affecting the critical oxide bonding surface 102. The strip and clean process can be difficult, because plasma ashing can lead to surface roughening, which degrades the quality of the bond to be formed. Chemical-mechanical planarization (CMP) 116 provides an alternative method of cleaning after stripping the resist, but leads to increased rounding 118 on the edges 112 of the cavities 100 because the lack of material in the cavities 100 allows a slight deformation of mechanical polisher 116 at the very edge 112 resulting in marginally higher oxide polishing rates near the cavity edges 112. This slight perturbation of the polisher 116 at the edges 112 results in undesirable rounding 118 of the cavity edges.

SUMMARY

Improved bonding surfaces for microelectronics are provided. An example method of protecting an oxide surface for direct bonding during a microelectronics fabrication process includes overfilling cavities and trenches in the oxide surface with a temporary filler that has an approximately equal chemical and mechanical resistance to a chemical-mechanical planarization (CMP) process as the oxide bonding surface. The CMP process is applied to the temporary filler to flatten the temporary filler down to the oxide bonding surface. The temporary filler is then removed with an etchant that is selective to the temporary filler, but nonreactive toward the oxide surface and toward inner surfaces of the cavities and trenches in the oxide bonding surface. Edges of the cavities remain sharp, which minimizes oxide artifacts, strengthens the direct bond, and reduces the bonding seam.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

This disclosure describes systems and processes for improving bonding surfaces for microelectronics. The example processes described herein lead to stronger direct bonds with higher bond integrity, in microelectronics packages. The example techniques are especially useful for fabricating bonded wafers that have cavities and trenches in the surfaces to be joined at the bonding interface, especially during direct-oxide bonding (oxide-to-oxide direct-bonding) of the surfaces to be joined.

Figure 2:
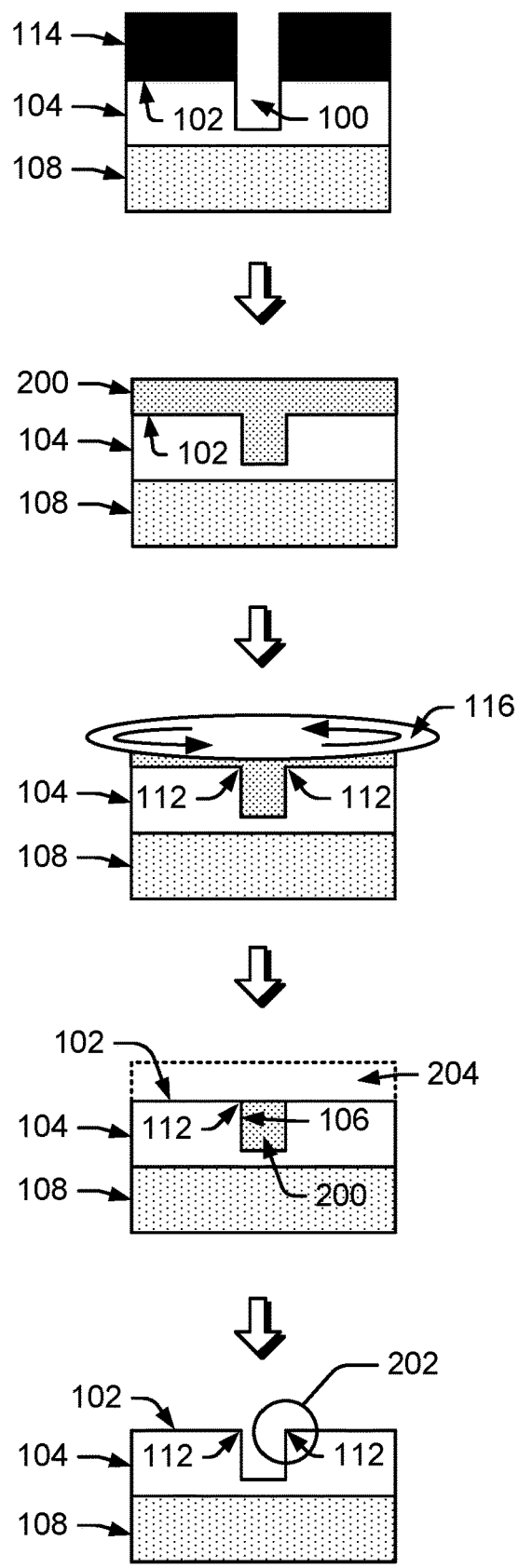
FIG. 2 is a diagram of an example method of protecting a bonding surface that has cavities, during preparation for direct-bonding.

FIG. 2 shows an example process for improving a bonding surface 102 that has cavities. The example process starts with patterning using a photoresist 114 and subsequent etching to create a cavity 100 in an oxide layer 104 of a die or wafer. The bonding surface 102 of the oxide layer 104 is then cleared of the photoresist 114. Removing the photoresist 114 and residues uses stripping and cleaning processes to some degree. The stripping and cleaning processes can impart an undesirable surface roughening that is detrimental to the goal of direct-bonding the bonding surface 102 to an opposing surface.

Before CMP polishing is applied, a sacrificial material or temporary filler 200 is deposited in the cavity 100 and overfilled onto the bonding surface 102. The temporary filler 200 is selected to have CMP removal properties that are very similar to the CMP removal properties of the oxide layer 104 itself. The oxide layer 104 and the temporary filler 200 are intended to be as close as possible to being indistinguishable to the CMP process 116, so that the CMP process 116 has a similar or the same 1:1 selectivity to the temporary filler 200 as to the oxide layer 104 with respect to both the chemical component of the CMP polishing and the mechanical component of the CMP polishing. After placement of the sacrificial material or temporary filler 200, the die or wafer then undergoes the CMP process, which planarizes the temporary filler 200 down to the bonding surface 102. The temporary filler 200 ensures that the edges (corners) 112 of the cavity 100 remain sharp 202, and that any rounding tendency (118 in FIG. 1) near the cavity edge 112 or corners is minimized or eliminated altogether.

Next, a second etchant 204 is applied, such as a wet-chemical etchant 204, that is selective or highly selective to the temporary filler 200, but not to the oxide layer 104. The second etchant 204 removes the temporary filler 200, while remaining nonreactive to the oxide layer 104, including the inner surfaces 106 of the cavity 100.

In an implementation, the oxide layer 104 is a silicon oxide, and the sacrificial material or temporary filler 200 is silicon nitride. Phosphoric acid may be used as the second etchant 204 that is selective to the silicon nitride 200 but nonreactive with respect to the silicon oxide 104.

Figure 1:
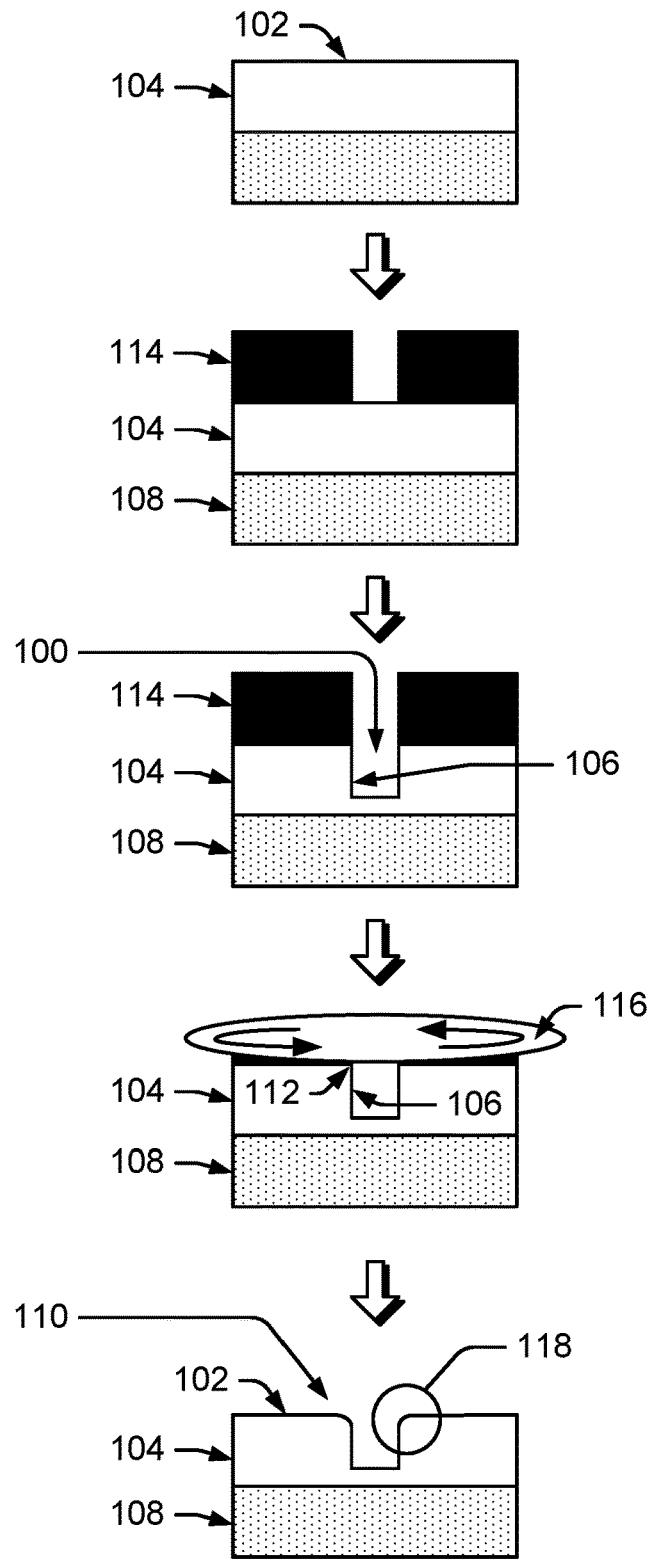
FIG. 1 is a diagram of an example conventional process for making cavities in a bonding surface for microelectronics.

An advantage of the example process shown in FIG. 2 is that the CMP process 116 may be applied after formation of the cavity 100 so that the bonding surface 102 can be prepared with improved flatness and with roughness eliminated without risking an increase in conventional rounding (118 in FIG. 1) of the cavity edges 112 due to exposure of open cavity edges 112 during the polish 116, as shown back in FIG. 1.

The cavity 100 as shown in FIG. 2 only extends into the oxide layer 104, but the cavity 100 can extend into layers below the oxide layer 104 too. Since lower layers beneath the oxide layer 104 are not involved with the CMP process 116, the selectivity of the CMP process 116 to these lower layers, such as silicon, is not important to the example process described here. However, the etchant 204 for removing the temporary filler 200 should be nonreactive with respect to these lower layers, just as the selective etchant 204 is nonreactive with the oxide layer 104.

Figure 3:
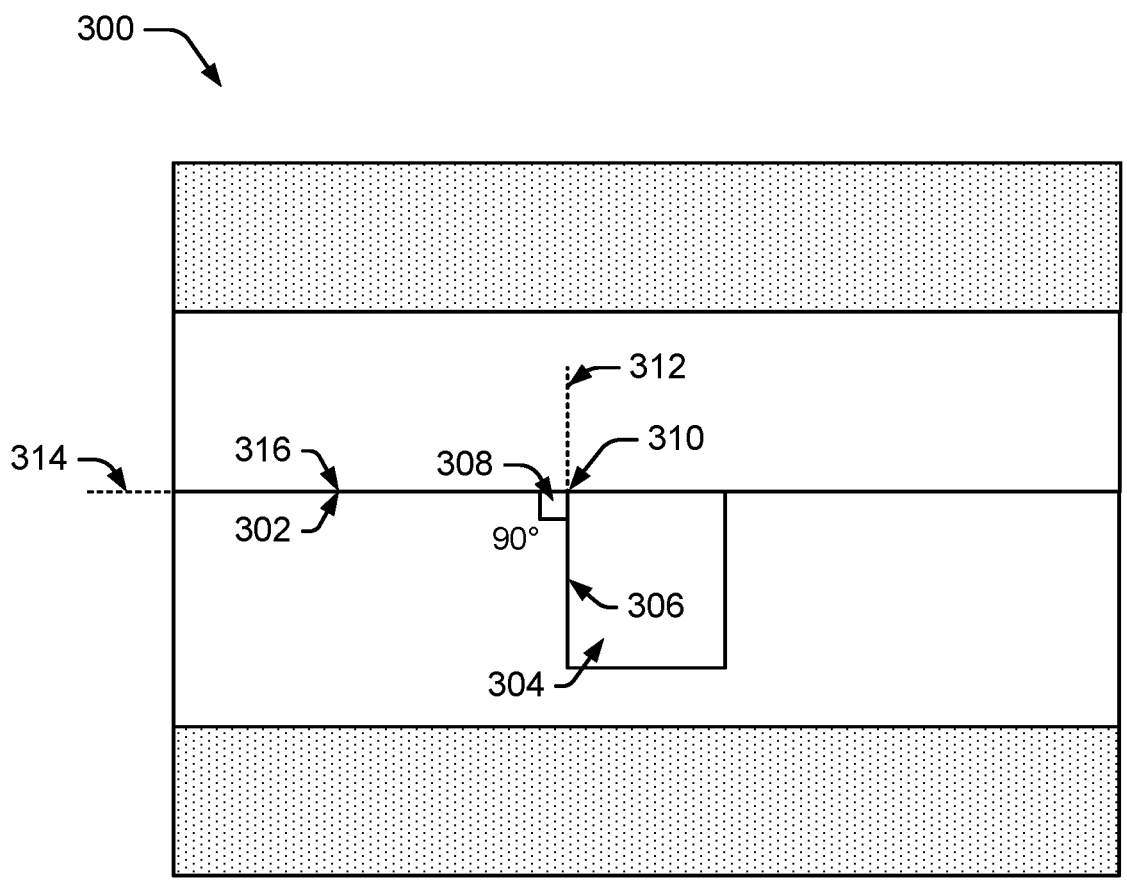
FIG. 3 is a diagram of an example bonded wafer with cavities that have sharp corners with a few angstroms for direct bonding with a second surface.

FIG. 3 shows a cross-sectional close-up of an example bonded wafer 300. A first horizontal bonding surface 302 of the bonded wafer is made of a dielectric material, such as silicon dioxide. The first horizontal bonding surface 302 has been flattened by a chemical-mechanical planarization (CMP) process. A cavity 304 has been created in the first horizontal bonding surface 302, by etching for example. A vertical wall 306 of the cavity 304 is disposed at a 90° angle to the first horizontal bonding surface 302. The dielectric material of the vertical wall 306 of the cavity 304 and the dielectric material of the first horizontal bonding surface 302 make a 90° corner 308 at a line or a point 310. The 90° corner 308 made of the dielectric material defines an intersection of a vertical plane 312 of the vertical wall 306 of the cavity 304 and a horizontal plane 314 of the first horizontal bonding surface 302.

The first horizontal bonding surface 302 of the bonded wafer 300 can be flattened by the chemical-mechanical planarization (CMP) process to a depth of field of a standard photolithography system. The flatness of the first horizontal bonding surface 302 may be smooth (flat or planar) by the CMP process to within less than 5 angstroms (Å). Ideally, an obtainable flatness has a slope equivalent to 5 nm in vertical rise variation over each 100 μm span of horizontal run. A desirable roughness specification is preferably less than 0.5 nm RMS. These are preferred values to be achieved, but the example systems and processes described herein still work outside of these preferred goals. The 90° corner 308 made of dielectric material where the vertical wall 306 of the cavity 304 meets the first horizontal bonding surface 302 may form a more perfect geometric 90° corner 308 with little or no rounding in the dielectric material, to within a few angstroms. Most conventional etches try to achieve as good a 90° corner as possible, but conventional industrial processes may deviate the corner by +/−3° from a 90° corner.

A second horizontal bonding surface 316 is direct-bonded to the first horizontal bonding surface 302. The first horizontal bonding surface 302 and the second horizontal bonding surface 316 may be direct-bonded together with an oxide-to-oxide direct bond. The oxide-to-oxide direct-bond between the first horizontal bonding surface 302 and the second horizontal bonding surface 316 is present at a geometric point 310 where the vertical wall 306 of the cavity 304 and the horizontal bonding surface 302 meet at the 90° corner 308.

The bonded wafer 300 may be two wafers direct-bonded together by a wafer-to-wafer process or may be a die and a wafer direct-bonded together by a die-to-wafer process.

Example Process Flows

Figure 4:
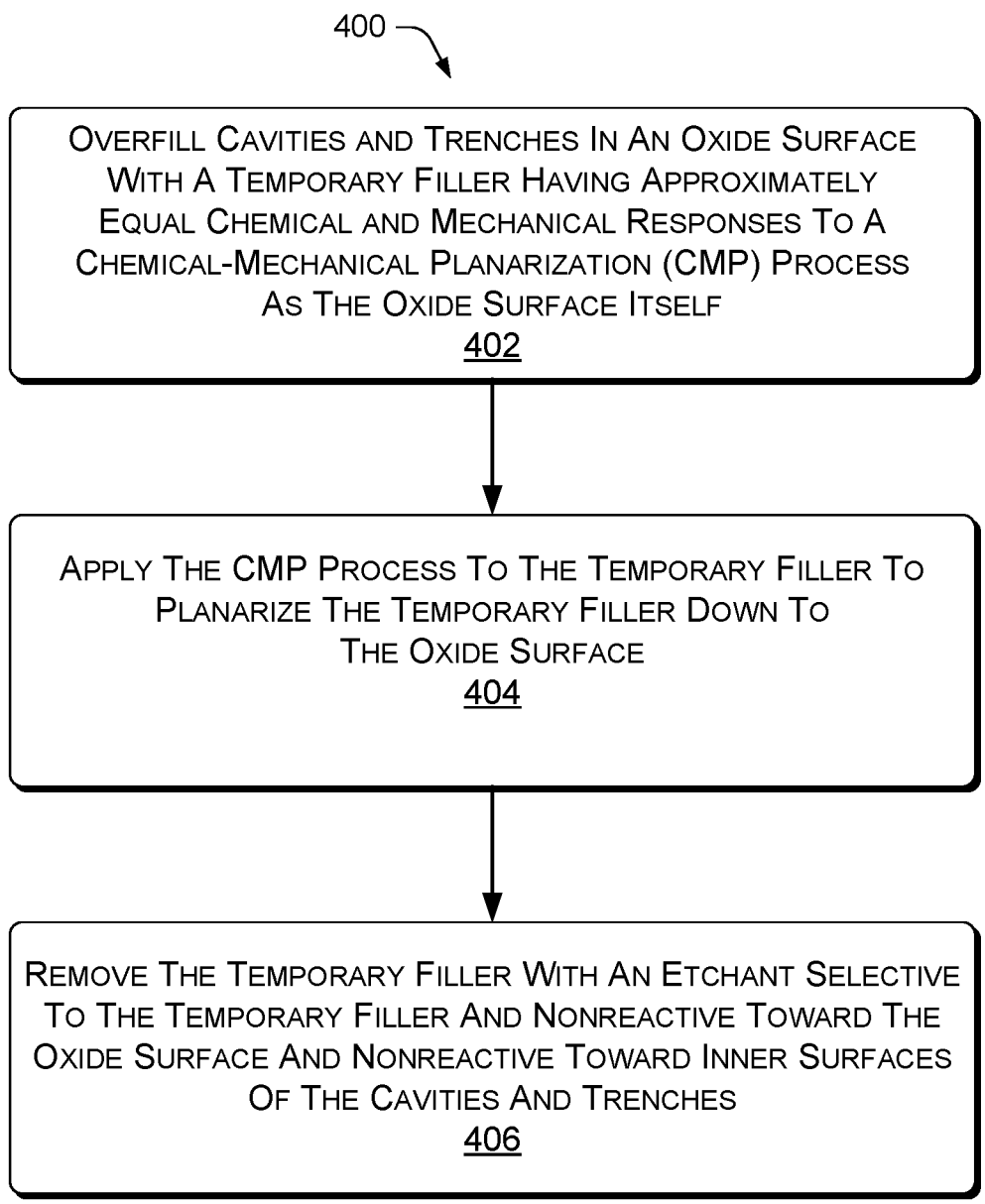
FIG. 4 is a flow diagram of an example method for protecting an oxide surface for bonding during a microelectronics fabrication process.

FIG. 4 shows an example of method 400 of protecting an oxide surface for bonding during a microelectronics fabrication process. Operations of the example method 400 are shown in individual blocks.

At block 402, cavities and trenches in the oxide surface are overfilled with a temporary filler having approximately equal chemical and mechanical responses to a chemical-mechanical planarization (CMP) process as the oxide surface itself.

At block 404, the CMP process is applied to the temporary filler to planarize the temporary filler down to the oxide surface.

At block 406, the temporary filler is removed with an etchant that is selective to the temporary filler and nonreactive toward the oxide surface and nonreactive toward inner surfaces of the cavities and trenches.

The oxide surface may be a silicon oxide surface and the temporary filler may be silicon nitride, for example. In this case, the etchant can be a phosphoric acid etchant to selectively remove the silicon nitride while being nonreactive towards the silicon oxide surfaces.

Figure 5:
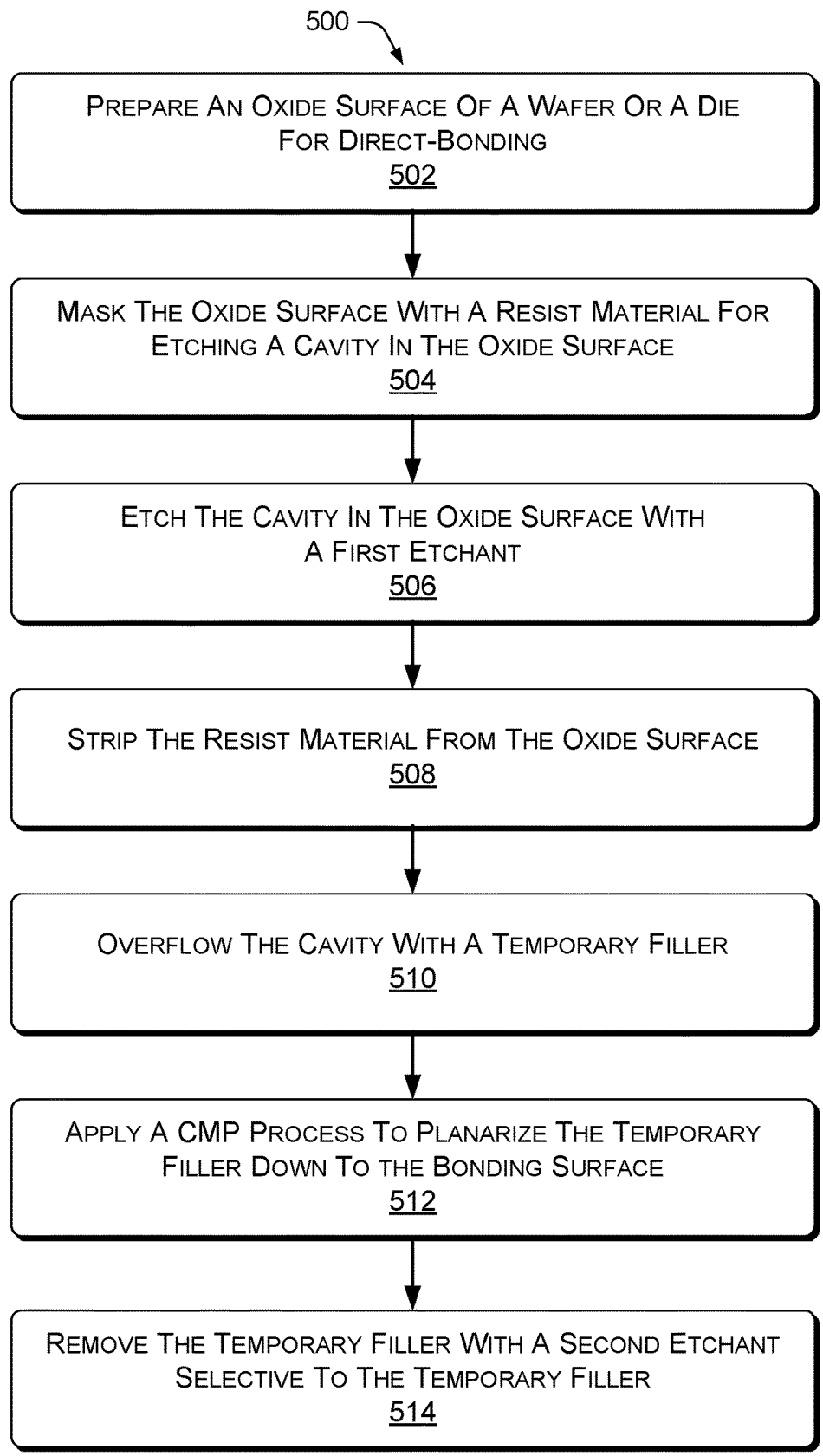
FIG. 5 is a flow diagram of an example method of an example method for improving bonding surfaces for microelectronics.

FIG. 5 shows an example method 500 of improving bonding surfaces for microelectronics. Operations of the example method 500 are shown in individual blocks.

At block 502, an oxide surface of a wafer or die is prepared for direct-bonding during a microelectronics fabrication process. The preparation includes planarization and cleaning of the surface, and sometimes activation of the surface molecules through plasma activation. In preparing the oxide surface before masking, the planarizing may bring the oxide surface to a flatness comparable to a depth of field of a photolithography system.

At block 504, the oxide surface is masked with a resist material for etching a cavity in the oxide surface.

At block 506, the cavity is etched in the oxide surface with a first etchant.

At block 508, the resist material is stripped from the oxide surface.

At block 510, the cavity is overflowed with a temporary filler to preserve edges of the cavity during a chemical-mechanical planarization (CMP) process, wherein the temporary filler possesses chemical and physical properties similar to the oxide surface with respect to the chemical-mechanical planarization (CMP) process, and wherein the CMP process has approximately equal selectivity for the oxide surface and the temporary filler.

At block 512, a CMP process is applied to planarize the temporary filler down to an interface between the temporary filler and the silicon oxide.

At block 514, the temporary filler is removed with a second etchant selective to the temporary filler and nonreactive to the oxide surface and nonreactive to the inner surfaces of the cavity.

The oxide surface may be a silicon oxide and the temporary filler may be silicon nitride. In this implementation, the second etchant can be phosphoric acid to selectively etch the silicon nitride while remaining nonreactive to the silicon oxide surface. The cavity may have a depth penetrating through a layer of the silicon oxide surface into an underlying layer below the layer of silicon oxide, such as a layer of silicon.

Figure 6:
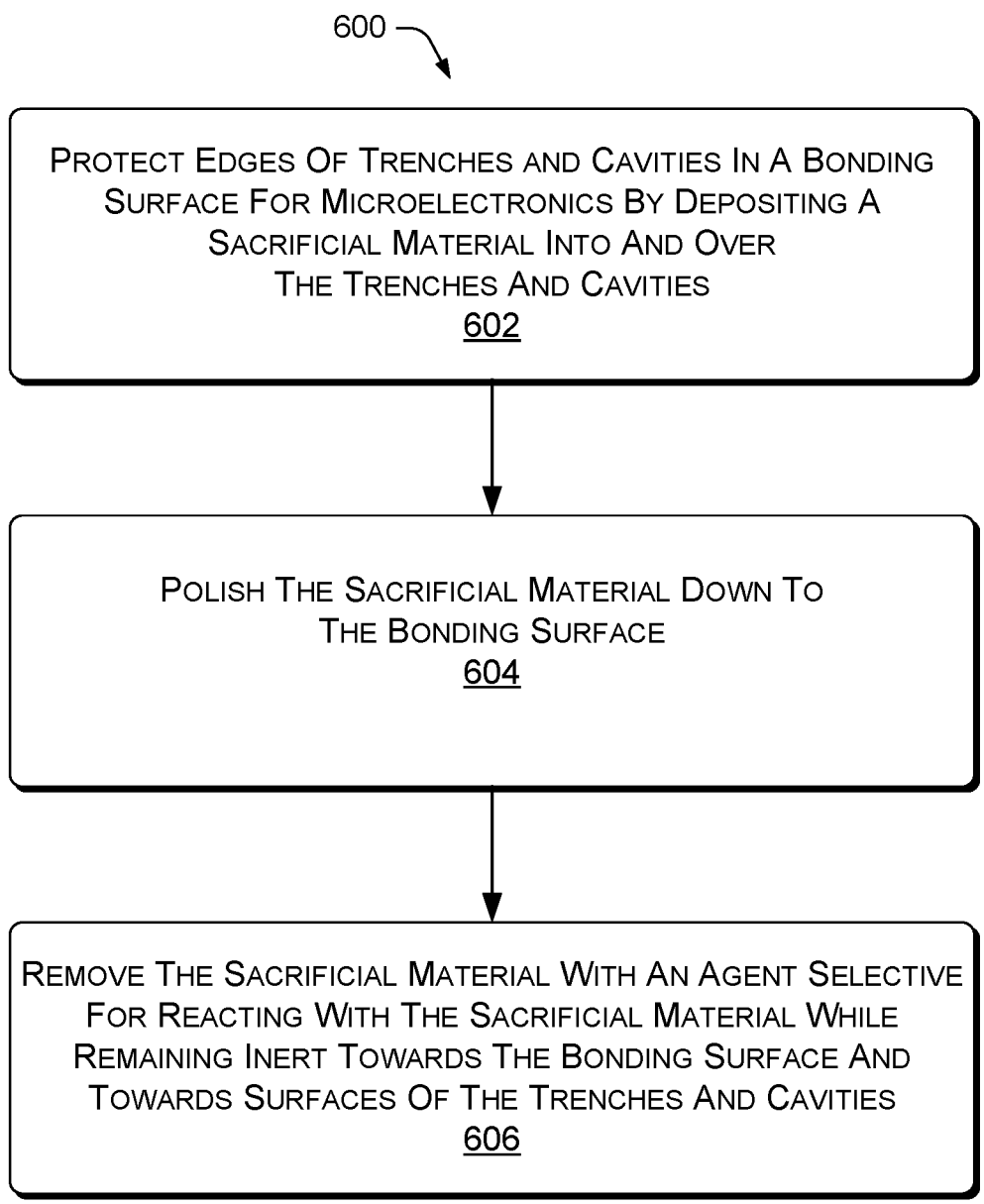
FIG. 6 is a flow diagram of an example method for protecting edges of trenches and cavities of a bonding surface for direct-bonding.

FIG. 6 shows an example method 600 of protecting edges of trenches and cavities of a bonding surface. Operations of the example method 600 are shown in individual blocks.

At block 602, edges of trenches and cavities in a bonding surface for microelectronics are protected by depositing a sacrificial material into and over the trenches and cavities.

At block 604, the sacrificial material is polished down to the bonding surface.

At block 606, the sacrificial material is removed with an agent selective for reacting with the sacrificial material while remaining inert towards the bonding surface and towards surfaces of the trenches and cavities.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method for preparing a surface for direct-bonding during a microelectronics fabrication process, comprising:
    overfilling cavities and trenches in a dielectric surface with a temporary filler, wherein the dielectric surface comprises an oxide layer, wherein the oxide layer comprises a layer of silicon oxide and the temporary filler comprises silicon nitride, and wherein the oxide layer and the temporary filler are indistinguishable to a CMP process such that the CMP process has a 1:1 selectivity to the temporary filler as to the oxide layer with respect to both a chemical component of the CMP process and a mechanical component of the CMP process;
    applying the CMP process to the temporary filler to planarize the temporary filler down to the dielectric surface; and
    applying an etchant to the temporary filler to remove the temporary filler from the cavities and trenches, the etchant selective to the temporary filler and nonreactive toward the dielectric surface and toward inner surfaces of the cavities and trenches.

2. The method of claim 1, wherein the etchant comprises a phosphoric acid etchant to selectively remove the silicon nitride while being nonreactive with the silicon oxide.

3. The method of claim 1, further comprising direct-bonding the dielectric surface to another dielectric surface.

4. The method of claim 1, further comprising:
    prior to the overfilling, preparing the dielectric surface for direct-bonding during a microelectronics fabrication process.

5. The method of claim 4, further comprising direct-bonding the dielectric surface to another dielectric surface.

6. The method of claim 4, wherein preparing the dielectric surface comprises planarizing the dielectric surface to a flatness comprising a depth of field of a photolithography system.

7. The method of claim 6, further comprising direct-bonding the dielectric surface to another dielectric surface.

8. The method of claim 1, further comprising:
prior to the overfilling, etching the cavities and trenches in the dielectric surface with a first etchant; and
stripping resist material from the dielectric surface.

9. A method, comprising:
preparing a dielectric surface of a wafer or die for direct-bonding during a microelectronics fabrication process, wherein the dielectric surface comprises an oxide layer;
masking the dielectric surface with a resist material for etching a cavity in the dielectric surface;
etching the cavity in the dielectric surface with a first etchant; stripping the resist material from the dielectric surface;
overflowing the cavity with a temporary filler to preserve edges of the cavity during a chemical-mechanical planarization (CMP) process, wherein the oxide layer comprises a layer of silicon oxide and the temporary filler comprises silicon nitride, and wherein the oxide layer and the temporary filler are indistinguishable to the CMP process such that the CMP process has a 1:1 selectivity to the temporary filler as to the oxide layer with respect to both a chemical component of the CMP process and a mechanical component of the CMP process;
applying the CMP process to planarize the temporary filler down to an interface between the temporary filler and the dielectric surface; and
removing the temporary filler from the cavity with a second etchant selective to the temporary filler and nonreactive to the dielectric surface and nonreactive to inner surfaces of the cavity.

10. The method of claim 9, wherein the second etchant comprises a phosphoric acid to selectively etch the silicon nitride while remaining nonreactive to the silicon oxide.

11. The method of claim 9, wherein the cavity has a depth penetrating through a layer of the silicon oxide into an underlying layer below the layer of silicon oxide.

12. The method of claim 9, wherein preparing the dielectric surface before masking further comprises planarizing the dielectric surface to flatness comprising a depth of field of a photolithography system.

13. The method of claim 12, further comprising direct-bonding the dielectric surface to another dielectric surface.

14. The method of claim 9, further comprising direct-bonding the dielectric surface to another dielectric surface.

* * * * *